United States Patent
Wu et al.

(10) Patent No.: US 8,052,895 B2
(45) Date of Patent: Nov. 8, 2011

(54) SEMICONDUCTING INK FORMULATION

(75) Inventors: Yiliang Wu, Mississauga (CA); Paul F. Smith, Oakville (CA)

(73) Assignee: Xerox Corporation, Norwalk, CT (US)

( * ) Notice: Subject to any disclaimer, the term of this patent is extended or adjusted under 35 U.S.C. 154(b) by 456 days.

(21) Appl. No.: 12/248,161

(22) Filed: Oct. 9, 2008

(65) Prior Publication Data
US 2010/0093129 A1    Apr. 15, 2010

(51) Int. Cl.
*H01B 1/12* (2006.01)
*H01B 1/20* (2006.01)

(52) U.S. Cl. ........................................ 252/500
(58) Field of Classification Search ............ 252/500
See application file for complete search history.

(56) References Cited

U.S. PATENT DOCUMENTS

| | | | |
|---|---|---|---|
| 6,770,904 B2 | 8/2004 | Ong et al. | |
| 6,872,801 B2 | 3/2005 | Ong et al. | |
| 6,897,284 B2 | 5/2005 | Liu et al. | |
| 6,949,762 B2 | 9/2005 | Ong et al. | |
| 7,112,649 B2 | 9/2006 | Liu et al. | |
| 7,132,500 B2 | 11/2006 | Ong et al. | |
| 7,256,418 B2 | 8/2007 | Ong et al. | |
| 7,510,672 B2 * | 3/2009 | McCulloch et al. | 252/500 |
| 7,837,903 B2 * | 11/2010 | Liu et al. | 252/500 |
| 2005/0067949 A1 * | 3/2005 | Natarajan et al. | 313/504 |
| 2006/0115652 A1 * | 6/2006 | Yoshimoto et al. | 428/411.1 |
| 2006/0261314 A1 * | 11/2006 | Lang et al. | 252/500 |

OTHER PUBLICATIONS

Shin et al "Effect of alkyl side-chain length and solvent on the luminescent characteristics of poly(3-n-alkylthiophene)", Synthetic Metals 140 (2004) 177-181.*

* cited by examiner

*Primary Examiner* — Mark Kopec
(74) *Attorney, Agent, or Firm* — Fay Sharpe LLP

(57) ABSTRACT

A semiconducting ink formulation comprises a semiconducting material; a first solvent; and a second solvent which is miscible with the first solvent, has a surface tension equal to or greater than the surface tension of the first solvent, and in which the semiconducting material has a solubility of less than 0.1 wt % at room temperature The surface tension of the ink formulation can be controlled, allowing the formation of semiconducting layers in organic thin film transistors, including top-gate transistors.

19 Claims, 1 Drawing Sheet

SEMICONDUCTING INK FORMULATION

BACKGROUND

The present disclosure relates, in various embodiments, to formulations and processes suitable for use in electronic devices, such as thin film transistors ("TFT"s). The present disclosure also relates to components or layers produced using such compositions and processes, as well as electronic devices containing such materials.

Thin film transistors (TFTs) are fundamental components in modern-age electronics, including, for example, sensors, image scanners, and electronic display devices. TFTs are generally composed of a supporting substrate, three electrically conductive electrodes (gate, source and drain electrodes), a channel semiconducting layer, and an electrically insulating gate dielectric layer separating the gate electrode from the semiconducting layer. It is generally desired to make TFTs which have not only much lower manufacturing costs, but also appealing mechanical properties such as being physically compact, lightweight, and flexible. One approach is through organic thin-film transistors ("OTFT"s), wherein one or more components of the TFT includes organic compounds. In particular, some components can be deposited and patterned using inexpensive, well-understood printing technology.

Inkjet printing is believed to be a very promising method to fabricate OTFTs. As to the fabrication process, inkjet printing the organic semiconductor is a critical step. Accordingly, a jettable semiconductor ink is required.

One general approach to form an ink composition is to dissolve a semiconducting material in a proper solvent to form an ink solution for dispersion. The dispersion is typically suitable for printing the semiconducting material in a bottom-gate TFT configuration (see FIG. 1) wherein the substrate surface (the dielectric surface) has a low surface energy. However, the ink composition may not meet all requirements for inkjet printing, such as surface tension requirements. For example, the surface tension of some dispersions is too low for printing the semiconducting material on to a substrate with high surface energy such as in a top-gate TFT configuration (see FIG. 4). Low surface tension induces the semiconducting material to spread beyond the desired channel area, causing undesired capacitance. It would be desirable to provide a semiconducting ink formulation which has increased surface tension without changing the structure, molecular weight, and/or loading of the semiconducting material itself.

BRIEF DESCRIPTION

Disclosed, in various embodiments, are semiconducting ink formulations. The ink formulations allow for the control of surface tension and are thus useful in the manufacture of top-gate thin film transistors. Processes for making and using such formulations are also disclosed.

In some embodiments are disclosed semiconducting ink formulations comprising:

a semiconducting material comprising a thiophene moiety of Structure (A):

Structure (A)

wherein $R_1$ is selected from alkyl and substituted alkyl;
a first solvent; and
a second solvent which is miscible with the first solvent, has a surface tension equal to or greater than the surface tension of the first solvent, and in which the semiconducting material has a solubility of less than 0.1 wt % at room temperature.

In embodiments, the semiconducting material may have the structure of Formula (I):

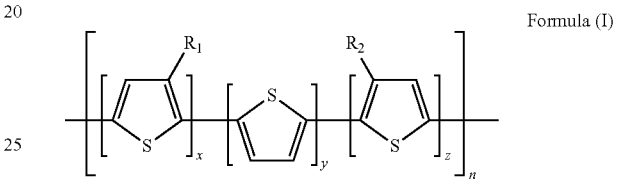

Formula (I)

wherein $R_1$ and $R_2$ are independently selected from alkyl and substituted alkyl; x, y, and z are independently from 1 to about 5; and n is the degree of polymerization.

$R_1$ and $R_2$ can be independently selected from alkyl having 1 to about 24 carbon atoms. In some embodiments, $R_1$ and $R_2$ are identical.

The semiconducting material may be Formula (II):

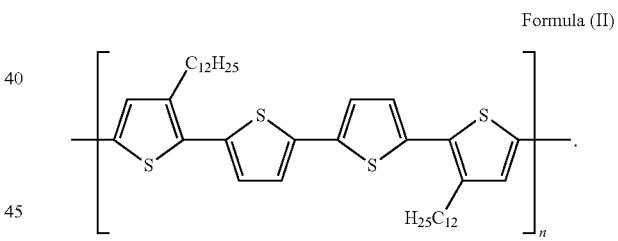

Formula (II)

The first solvent is a halogenated aromatic solvent, such as chlorobenzene, dichlorobenzene, trichlorobenzene, and chlorotoluene. In specific embodiments, the first solvent is 1,2-dichlorobenzene.

The second solvent may comprise a six-carbon ring, such as benzyl benzoate, methyl benzoate, acetophenone, 2'-chloroacetophenone, quinoline, and benzonitrile. In specific embodiments, the second solvent is benzyl benzoate.

In particular combinations, the first solvent is 1,2-dichlorobenzene and the second solvent is benzyl benzoate. The weight ratio of first solvent to second solvent may be from about 20:1 to about 20:10.

The ink formulation may have a surface tension of from about 28 mN/m to about 35 mN/m.

The semiconducting material may be present as both aggregates and dissolved molecules. In some embodiments, the aggregates are more than 50 percent by weight of the semiconducting material. In others, the aggregates are more than 80 percent by weight of the semiconducting material.

In other embodiments, methods of forming a semiconducting layer of a thin film transistor are disclosed which comprise:

a) providing an ink composition comprising:
   a semiconducting material comprising a thiophene moiety of Structure (A):

Structure (A)

wherein $R_1$ is selected from alkyl and substituted alkyl;
   a first solvent; and
   a second solvent which is miscible with the first solvent, has a surface tension equal to or greater than the surface tension of the first solvent, and in which the semiconducting material has a solubility of less than 0.1 wt % at room temperature;

b) applying the ink composition over a substrate of the transistor; and c) drying the ink composition to form a semiconducting layer.

In other embodiments, methods of controlling the surface tension of a semiconducting ink formulation are provided which comprise:

a) providing an ink composition comprising:
   a semiconducting material comprising a thiophene moiety of Structure (A):

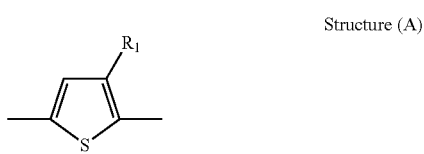

Structure (A)

wherein $R_1$ is selected from alkyl and substituted alkyl;
   a first solvent in which the semiconducting material has a solubility of 0.1 wt % or more at room temperature; and
   a second solvent which is miscible with the first solvent, has a surface tension equal to or greater than the surface tension of the first solvent, and in which the semiconducting material has a solubility of less than 0.1 wt % at room temperature; and b) adjusting the weight ratio of first solvent to second solvent to between about 20:1 and about 20:10 to control the surface tension of the ink composition.

The weight ratio of first solvent to second solvent may be from about 10:1 to about 10:3.

Also disclosed are the layers and/or thin film transistors produced by this process.

These and other non-limiting characteristics of the exemplary embodiments of the present disclosure are more particularly described below.

BRIEF DESCRIPTION OF THE DRAWINGS

The following is a brief description of the drawings, which are presented for the purpose of illustrating the exemplary embodiments disclosed herein and not for the purpose of limiting the same.

DETAILED DESCRIPTION

Figure 1:
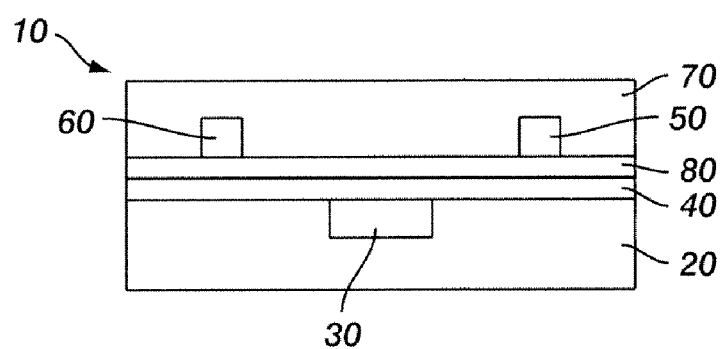
FIG. 1 is a first exemplary embodiment of an OTFT of the present disclosure.

A more complete understanding of the components, processes, and apparatuses disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

FIG. 1 illustrates a first bottom-gate OTFT embodiment or configuration. The OTFT 10 comprises a substrate 20 in contact with the gate electrode 30 and a dielectric layer 40. Although here the gate electrode 30 is depicted within the substrate 20, this is not required. However, of some importance is that the dielectric layer 40 separates the gate electrode 30 from the source electrode 50, drain electrode 60, and the semiconducting layer 70. The source electrode 50 contacts the semiconducting layer 70. The drain electrode 60 also contacts the semiconducting layer 70. The semiconducting layer 70 runs over and between the source and drain electrodes 50 and 60. Optional interfacial layer 80 may be located between dielectric layer 40 and semiconducting layer 70.

Figure 2:
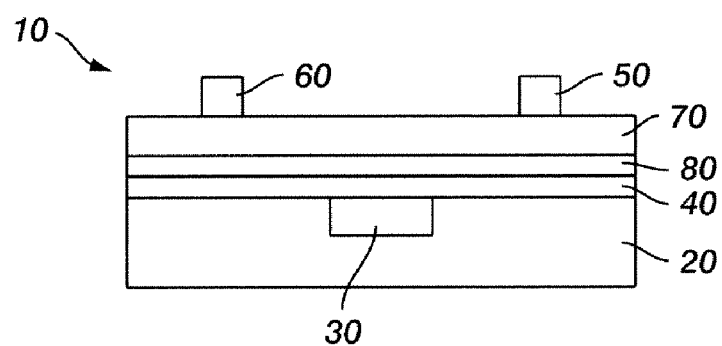
FIG. 2 is a second exemplary embodiment of an OTFT of the present disclosure.

FIG. 2 illustrates a second bottom-gate OTFT embodiment or configuration. The OTFT 10 comprises a substrate 20 in contact with the gate electrode 30 and a dielectric layer 40. The semiconducting layer 70 is placed over or on top of the dielectric layer 40 and separates it from the source and drain electrodes 50 and 60. Optional interfacial layer 80 may be located between dielectric layer 40 and semiconducting layer 70.

Figure 3:
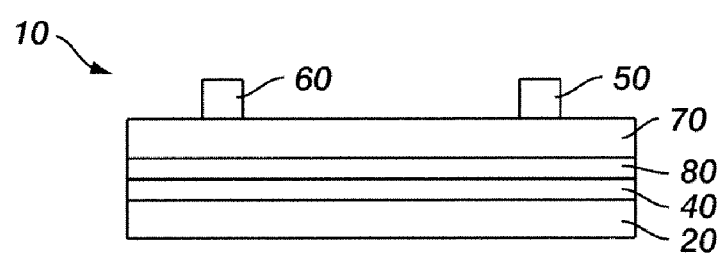
FIG. 3 is a third exemplary embodiment of an OTFT of the present disclosure.

FIG. 3 illustrates a third bottom-gate OTFT embodiment or configuration. The OTFT 10 comprises a substrate 20 which also acts as the gate electrode and is in contact with a dielectric layer 40. The semiconducting layer 70 is placed over or on top of the dielectric layer 40 and separates it from the source and drain electrodes 50 and 60. Optional interfacial layer 80 may be located between dielectric layer 40 and semiconducting layer 70.

Figure 4:
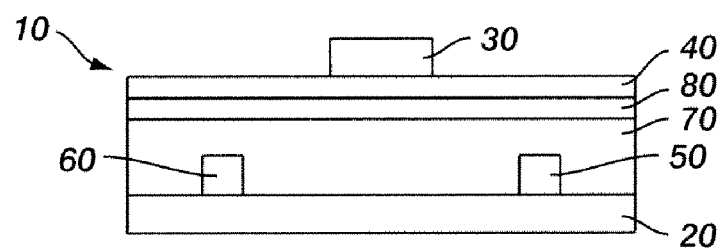
FIG. 4 is a fourth exemplary embodiment of an OTFT of the present disclosure.

FIG. 4 illustrates a top-gate OTFT embodiment or configuration. The OTFT 10 comprises a substrate 20 in contact with the source electrode 50, drain electrode 60, and the semiconducting layer 70. The semiconducting layer 70 runs over and between the source and drain electrodes 50 and 60. The dielectric layer 40 is on top of the semiconducting layer 70. The gate electrode 30 is on top of the dielectric layer 40 and does not contact the semiconducting layer 70. Optional interfacial layer 80 may be located between dielectric layer 40 and semiconducting layer 70.

The semiconducting layer may be formed from a semiconducting ink formulation which is suitable for use in forming a thin film transistor, including a top-gate thin film transistor. The semiconducting ink formulation comprises a semiconducting material, a first solvent A, and a second solvent B.

In embodiments, the semiconducting material comprises a thiophene moiety of Structure (A):

Structure (A)

wherein $R_1$ is alkyl or substituted alkyl. In preferred embodiments, the semiconducting material is a polymeric semiconducting material.

In further embodiments, the semiconducting material is of Formula (I):

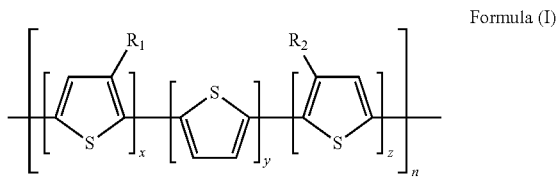

Formula (I)

wherein $R_1$ and $R_2$ are independently selected from alkyl and substituted alkyl; x, y, and z are independently from 1 to about 5; and n is the degree of polymerization. n is usually a number from 2 to about 10,000, preferably from about 5 to about 50. In particular embodiments, $R_1$ and $R_2$ are independently selected from alkyl having 1 to about 24 carbon atoms, and in further embodiments $R_1$ and $R_2$ are identical. In particular embodiments, x and z are equal.

In specific embodiments, the semiconducting material is Formula (II):

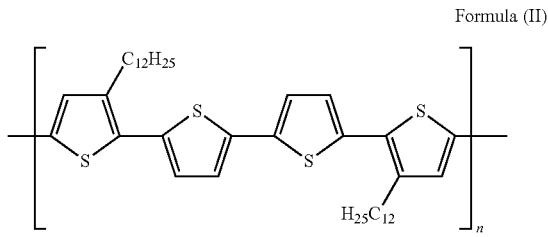

Formula (II)

wherein n is a number from 2 to about 100. This particular semiconducting material is also known as PQT-12. Other specific semiconducting materials include poly (3-alkylthiophene), and the semiconducting polymers disclosed in U.S. Pat. Nos. 6,770,904; 6,949,762; and 6,621,099, the disclosures of which are fully incorporated by reference herein.

With regards to the two solvents, the second solvent B is miscible with the first solvent A and has a surface tension equal to or greater than the surface tension of the first solvent A. The semiconducting material also has a solubility of less than 0.1 wt % at room temperature in the second solvent B. In some embodiments, the semiconducting material also has a solubility of 0.1 wt % or more at room temperature in the first solvent A.

In embodiments, the first solvent A is a halogenated aromatic solvent. Exemplary halogenated aromatic solvents include chlorobenzene, dichlorobenzene, trichlorobenzene, and chlorotoluene. In specific embodiments, the first solvent A comprises 1,2-dichlorobenzene.

In embodiments, the second solvent B comprises a six-carbon ring. In particular embodiments, the second solvent B comprises a solvent selected from the group consisting of benzyl benzoate, methyl benzoate, acetophenone, 2'-chloroacetophenone, quinoline, and benzonitrile. In specific embodiments, the second solvent B is benzyl benzoate.

In some specific embodiments, the first solvent A is 1,2-dichlorobenzene and the second solvent B is benzyl benzoate.

The semiconducting ink formulation is made by combining the first solvent A, second solvent B, and the semiconducting material. Typically, the semiconducting material is from about 0.1 to about 1.0 weight percent of the formulation, or from about 0.1 to about 0.5 weight percent of the formulation. In embodiments, the semiconducting material can be present in the form of both aggregates (for example, nano sized aggregates) and dissolved molecules in the ink formulation. The use of solvent B improves the surface tension of the mixture of solvents A and B only slightly, which will have a minor contribution to the enhanced surface tension of the ink composition. Using solvent B, on the other hand, decreases the solubility of the semiconducting material in the mixture of the two solvents A and B dramatically, which results in an increased population of nano sized aggregates that can be stabilized by solvent A and a reduced population of the dissolved molecules in the ink composition.

Without being bound by any theory, it is believed that the increased amount of aggregates and decreased amount of dissolved semiconducting molecules will result in a significant improvement in the surface tension of the ink composition. Since the semiconducting material is a surface active component, dissolved semiconducting molecules will lower the surface tension of the solvents significantly. In embodiments, the ink composition has a surface tension from about 28 mN/m to about 35 mN/m, or from about 30 mN/m to about 33 mN/m. The surface tension of the ink formulation can be adjusted by changing the ratio of solvent A to solvent B, since the population of aggregates can be adjusted by changing the ratio of solvent A to solvent B. In embodiments, the aggregates are more than 50 percent by weight of the semiconducting material in the ink composition, including more than 80 percent by weight of the semiconducting material in the ink composition.

In embodiments, the weight ratio of first solvent A to second solvent B is from about 20:1 to about 20:10, including from about 10:1 to about 10:3. By changing solvent B from 1 weight percent of the ink formulation to about 30 weight percent of the ink formulation, the population of aggregates in the semiconducting material can be increased by from about 10% to about 100%. The surface tension can be raised by a minimum of 5 millinewtons (mN) per meter compared to a formulation of the semiconducting material with solvent A only. This increase in the surface tension of the semiconducting ink formulation is much greater than the increase in surface tension of just the mixture of solvents A and B.

In embodiments, the semiconducting ink composition has a viscosity of from about 2 centipoises to about 40 centipoise, preferably from about 2 centipoise to 15 centipoise. This viscosity is suitable for inkjet printing.

The semiconducting ink formulation with increased surface tension can be used to form the semiconducting layer in a thin film transistor, particularly a top-gate transistor as depicted in FIG. 4. There, the organic semiconducting material may be deposited on a plastic substrate, rather than a hydrophobic gate dielectric material. The formulation is generally deposited onto a surface of the transistor and then dried to form the layer. Exemplary deposition methods include liquid deposition such as spin coating, dip coating, blade coating, rod coating, screen printing, stamping, ink jet printing, and the like, and other conventional processes known in the art. In embodiments, the deposition method is inkjet printing. The resulting semiconducting layer is from about 5 nm to about 1000 nm thick, especially from about 10 nm to about 100 nm thick.

The semiconducting ink composition having both solvents A and B has several advantages over the ink composition with solvent A only. First, the enhanced surface tension prevents leakage of ink from the printing nozzle. Second, when printed on a substrate, the resulting ink will form a smaller drop size due to higher surface tension, thus allowing for higher printing resolution. Third, the resulting ink will prevent spreading of the semiconducting layer, especially in top-gate transistor fabrication, wherein the semiconducting layer is printed in most cases on a high energy substrate surface.

The substrate may be composed of materials including but not limited to silicon, glass plate, plastic film or sheet. For structurally flexible devices, plastic substrate, such as for example polyester, polycarbonate, polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon.

The gate electrode is composed of an electrically conductive material. It can be a thin metal film, a conducting polymer film, a conducting film made from conducting ink or paste or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite or silver colloids. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges from about 10 to about 500 nanometers for metal films and from about 0.5 to about 10 micrometers for conductive polymers.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about 10-12 Siemens per centimeter (S/cm). The dielectric layer is formed using conventional processes known in the art, including those processes described in forming the gate electrode.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers. The OTFT devices of the present disclosure contain a semiconductor channel. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the OTFT may be deposited upon the substrate in any order, as is seen in the Figures. The term "upon the substrate" should not be construed as requiring that each component directly contact the substrate. The term should be construed as describing the location of a component relative to the substrate. Generally, however, the gate electrode and the semiconducting layer should both be in contact with the dielectric layer. In addition, the source and drain electrodes should both be in contact with the semiconducting layer. The semiconducting polymer formed by the methods of the present disclosure may be deposited onto any appropriate component of an organic thin-film transistor to form a semiconducting layer of that transistor.

The following examples illustrate the methods and apparatuses of the present disclosure. The examples are merely illustrative and are not intended to limit the present disclosure with regard to the materials, conditions, or process parameters set forth therein.

EXAMPLES

Comparative Example 1

22 milligrams of PQT-12 was dissolved in 10 grams 1,2-dichlorobenzene by heating to form a yellow-red solution. The hot solution was allowed to cool down to room temperature in a water bath while an ultrasonic vibration was applied (100 W sonicator at 42 kHz) for 10 to 15 minutes. The yellow-red solution became dark purple when it was completely cooled to room temperature. The dark purple composition was filtered with a 1 micron syringe filter to remove any large particles to obtain a stable semiconducting ink formulation.

A stable semiconductor ink was obtained, and the surface tension of the ink was measured to be 25.20 mN/m at room temperature which is significantly lower than that of 1,2-dichlorobenzene (37.8 mN/m). This indicates that PQT-12 semiconductor is a surface active polymer which lowers the surface tension of the PQT-12/1,2-dichlorobenzene composition dramatically even at a very low concentration about 0.2 wt %.

Comparative Example 2

2.0 milligrams of PQT-12 was added to 1.0 gram of benzyl benzoate. The mixture was heated to about 120° C. to dissolve the PQT-12 and allowed to cool down to room temperature in a water bath while an ultrasonic vibration was applied. The polymer precipitated out and no stable ink formulation could be formed.

Comparative Example 3

2.0 milligrams of PQT-12 was added to 1.0 gram of quinoline. The mixture was heated to about 120° C. to dissolve the PQT-12 and allowed to cool down to room temperature in a water bath while an ultrasonic vibration was applied. The polymer precipitated out and no stable ink formulation could be formed.

Example 1

Three mixtures of 1,2-dichlorobenzene (solvent A) and benzyl benzoate (solvent B) were made, varying by the weight ratio of solvent A to solvent B, and labeled as 1A (10:1), 1B (10:2), and 1C (10:3). PQT-12 was dissolved into the mixture at the same concentration as in Comparative Example 1 (i.e. 22 mg/g solvent). The mixtures were then sonicated to form dark purple compositions. After filtering, stable semiconducting ink formulations were obtained.

Results

The surface tension of the solvent mixtures (i.e. prior to adding the semiconducting material) and the ink formulation (i.e. after adding the semiconducting material) were measured. The results are shown in Table 1. The amounts of solvents A and B are in parts by weight. The percent improvement is measured relative to Comparative Example 1.

TABLE 1

| Formulation | parts 1,2-dichloro-benzene (solvent A) | parts benzyl ben-zoate (solvent B) | Surface tension of only the mixed solvents (mN/m) | % Im-prove-ment | Surface tension of the ink formu-lation (mN/m) | % Im-prove-ment |
|---|---|---|---|---|---|---|
| Comparative Example 1 | 10 | 0 | 37.8 | | 25.20 | |
| Comparative Example 2 | 0 | 1 | ~43 | | NA | |
| Example 1A | 10 | 1 | 38.02 | 0.6 | 27.70 | 9.9 |
| Example 1B | 10 | 2 | 38.21 | 1.1 | 29.60 | 17.5 |
| Example 1C | 10 | 3 | 38.50 | 1.9 | 32.30 | 28.2 |

Adding the PQT to the mixed solvents decreased the surface tension in all of the formulations. This indicated that PQT-12 is a surface active polymer. The addition of benzyl benzoate (solvent B) up to 23 wt % (Example 1C) increased the surface tension of just the mixed solvents (A and B) by less than 1 mN/m, or ~2%, compared to Comparative Example 1. However, the surface tension of the ink formulation was increased by approximately 7 mN/m, or approximately 30%, compared to Comparative Example 1. This large change in the surface tension of the ink formulation was unexpected, as it was expected that the change in surface tension would be about the same as the change in surface tension of the two mixed solvents. The surface tension could be adjusted by changing the weight ratio of the two solvents as well.

Thin film transistors were fabricated with the semiconducting ink formulations. An n-doped silicon wafer with a thermally grown silicon oxide layer of a thickness of about 200 nanometers thereon was used. The wafer functioned as the substrate and the gate electrode. The silicon oxide layer acted as the gate dielectric layer and had a capacitance of about 15 nF/cm². The silicon wafer was first cleaned with isopropanol, argon plasma, and isopropanol, then air dried. The wafer was then immersed in a 0.1 M solution of octyltrichlorosilane in toluene for 20 minutes at 60° C. to modify the dielectric surface. The wafer was washed with toluene and isopropanol, then dried. The formulation of Example 1C was spin-coated on top of the modified silicon oxide surface, followed by drying and annealing in vacuum oven. Gold source and drain electrodes were evaporated on top of the semiconductor layer to complete the device.

The transistors were characterized with a Keithley 4200 SCS under ambient conditions. The devices showed a field effect mobility of 0.1 cm²/N·sec with a current on/off ratio over $10^6$. This performance was comparable to devices fabricated from the formulation of Comparative Example 1, that the presence of solvent B had no adverse effect on device performance.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A semiconducting ink formulation, comprising:
    a semiconducting material comprising a thiophene moiety of Structure (A):

Structure (A)

wherein $R_1$ is selected from alkyl and substituted alkyl;
a first solvent; and
a second solvent which is miscible with the first solvent, has a surface tension equal to or greater than the surface tension of the first solvent, and in which the semiconducting material has a solubility of less than 0.1 wt % at room temperature;
wherein the second solvent is selected from the group consisting of benzyl benzoate, methyl benzoate, acetophenone, 2'-chloroacetophenone, quinoline, and benzonitrile.

2. The ink formulation of claim 1, wherein the semiconducting material is of Formula (I):

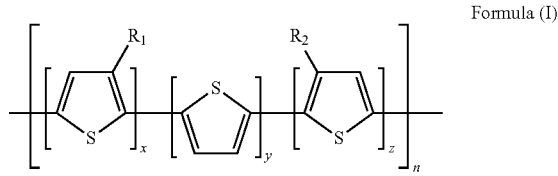

Formula (I)

wherein $R_1$ and $R_2$ are independently selected from alkyl and substituted alkyl; x, y, and z are independently from 1 to about 5; and n is the degree of polymerization.

3. The ink formulation of claim 2, wherein $R_1$ and $R_2$ are independently selected from alkyl having 1 to about 24 carbon atoms.

4. The ink formulation of claim 3, wherein $R_1$ and $R_2$ are identical.

5. The ink formulation of claim 2, wherein the semiconducting material is Formula (II):

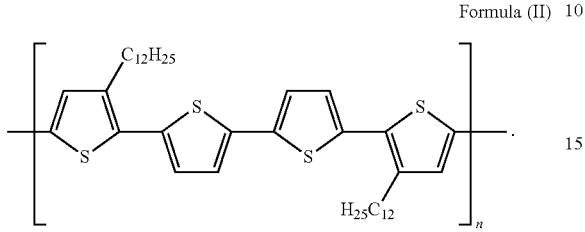

Formula (II)

6. The ink formulation of claim 1, wherein the first solvent is a halogenated aromatic solvent.

7. The ink formulation of claim 6, wherein the first solvent is a solvent selected from the group consisting of chlorobenzene, dichlorobenzene, trichlorobenzene, and chiorotoluene.

8. The ink formulation of claim 7, wherein the first solvent is 1,2- dichlorobenzene.

9. The ink formulation of claim 1, wherein the second solvent is benzyl benzoate.

10. The ink formulation of claim 1, wherein the first solvent is 1,2- dichlorobenzene and the second solvent is benzyl benzoate.

11. The ink formulation of claim 1, wherein the weight ratio of first solvent to second solvent is from about 20:1 to about 20:10.

12. The ink formulation of claim 1, wherein the ink formulation has a surface tension of from about 28 mN/m to about 35 mN/m.

13. The ink formulation of claim 1, wherein the semiconducting material is present as both aggregates and dissolved molecules, and the aggregates are more than 50 percent by weight of the semiconducting material.

14. The ink formulation of claim 13, wherein the aggregates are more than 80 percent by weight of the semiconducting material.

15. A semiconducting ink formulation, comprising:
a semiconducting material comprising a thiophene moiety of Structure (A):

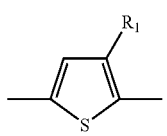

Structure (A)

wherein $R_1$ is selected from alkyl and substituted alkyl;

a first solvent which is a halogenated aromatic solvent; and a second solvent which comprises a six-carbon ring, is miscible with the first solvent, has a surface tension equal to or greater than the surface tension of the first solvent, and in which the semiconducting material has a solubility of less than 0.1 wt % at room temperature;

wherein the weight ratio of first solvent to second solvent is from about 20:1 to about 20:10.

16. A method of controlling the surface tension of a semiconducting ink formulation, comprising:

a) providing an ink composition comprising:
a semiconducting material comprising a thiophene moiety of Structure (A):

Structure (A)

wherein $R_1$ is selected from alkyl and substituted alkyl;
a first solvent in which the semiconducting material has a solubility of 0.1 wt % or more at room temperature; and
a second solvent which is miscible with the first solvent, has a surface tension equal to or greater than the surface tension of the first solvent, and in which the semiconducting material has a solubility of less than 0.1 wt % at room temperature; and b) adjusting the weight ratio of first solvent to second solvent to between about 20:1 and about 20:10 to control the surface tension of the ink composition.

17. The method of claim 16, wherein the semiconducting material is Formula (II):

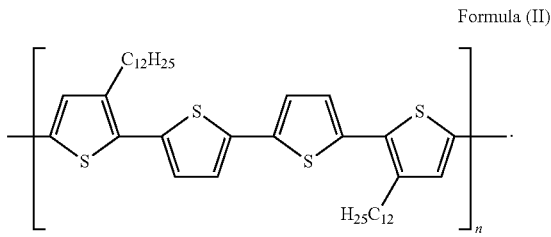

Formula (II)

18. The method of claim 16, wherein the first solvent is 1,2-dichlorobenzene and the second solvent is benzyl benzoate.

19. The method of claim 16, wherein the weight ratio of first solvent to second solvent is from about 10:1 to about 10:3.

* * * * *